US010163799B2

(12) United States Patent
Chen et al.

(10) Patent No.: US 10,163,799 B2
(45) Date of Patent: Dec. 25, 2018

(54) SEMICONDUCTOR STRUCTURE AND METHOD OF MANUFACTURING THE SAME

(71) Applicant: TAIWAN SEMICONDUCTOR MANUFACTURING COMPANY LTD., Hsinchu (TW)

(72) Inventors: Ming-Fa Chen, Hsinchu (TW); Sung-Feng Yeh, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 10 days.

(21) Appl. No.: 15/345,018

(22) Filed: Nov. 7, 2016

(65) Prior Publication Data

US 2018/0130744 A1    May 10, 2018

(51) Int. Cl.
| | |
|---|---|
| *H01L 23/538* | (2006.01) |
| *H01L 21/768* | (2006.01) |
| *H01L 23/367* | (2006.01) |
| *H01L 23/00* | (2006.01) |
| *H01L 33/32* | (2010.01) |
| *H01L 33/62* | (2010.01) |
| *H01L 29/20* | (2006.01) |

(52) U.S. Cl.
CPC .... *H01L 23/5384* (2013.01); *H01L 21/76877* (2013.01); *H01L 23/3675* (2013.01); *H01L 24/13* (2013.01); *H01L 33/32* (2013.01); *H01L 33/62* (2013.01); *H01L 23/367* (2013.01); *H01L 29/2003* (2013.01); *H01L 2224/13024* (2013.01); *H01L 2933/0033* (2013.01); *H01L 2933/0066* (2013.01)

(58) Field of Classification Search
CPC ........... H01L 23/5384; H01L 21/76877; H01L 23/3675; H01L 24/13; H01L 29/2003; H01L 33/32; H01L 33/62; H01L 2224/13024; H01L 2933/0033; H01L 2933/0066
See application file for complete search history.

(56) References Cited

U.S. PATENT DOCUMENTS

| | | | | |
|---|---|---|---|---|
| 2010/0140779 A1* | 6/2010 | Lin | ................... | H01L 23/49816 257/690 |
| 2012/0280374 A1* | 11/2012 | Choi | ...................... | H01L 21/50 257/659 |
| 2013/0026643 A1* | 1/2013 | England | ................ | H01L 21/561 257/774 |

(Continued)

*Primary Examiner* — Fernando L Toledo
*Assistant Examiner* — Neil R Prasad
(74) *Attorney, Agent, or Firm* — WPAT, P.C., Intellectual Property Attorneys; Anthony King

(57) ABSTRACT

The present disclosure provides a semiconductor structure, including a first silicon layer having a through silicon via (TSV), a III-V structure over the first silicon layer, electrically coupling to the TSV, and a redistribution layer (RDL) under the first silicon layer, electrically coupling to the TSV. The present disclosure also provides a method of manufacturing a semiconductor device. The method includes providing a III-V-on-Si structure, comprising a III-V device over a silicon layer, forming a through silicon via (TSV) in the silicon layer, electrically coupling to the III-V device, and forming a redistribution layer (RDL) over a side of the silicon layer opposite to the III-V device.

20 Claims, 23 Drawing Sheets

(56) References Cited

U.S. PATENT DOCUMENTS

| | | | |
|---|---|---|---|
| 2014/0133105 A1* | 5/2014 | Yee | H05K 7/20509 |
| | | | 361/720 |
| 2015/0233698 A1* | 8/2015 | Huang | H01L 24/05 |
| | | | 324/691 |
| 2015/0371938 A1* | 12/2015 | Katkar | H01L 25/50 |
| | | | 257/774 |
| 2016/0079220 A1* | 3/2016 | Lin | H01L 25/0652 |
| | | | 361/783 |

* cited by examiner

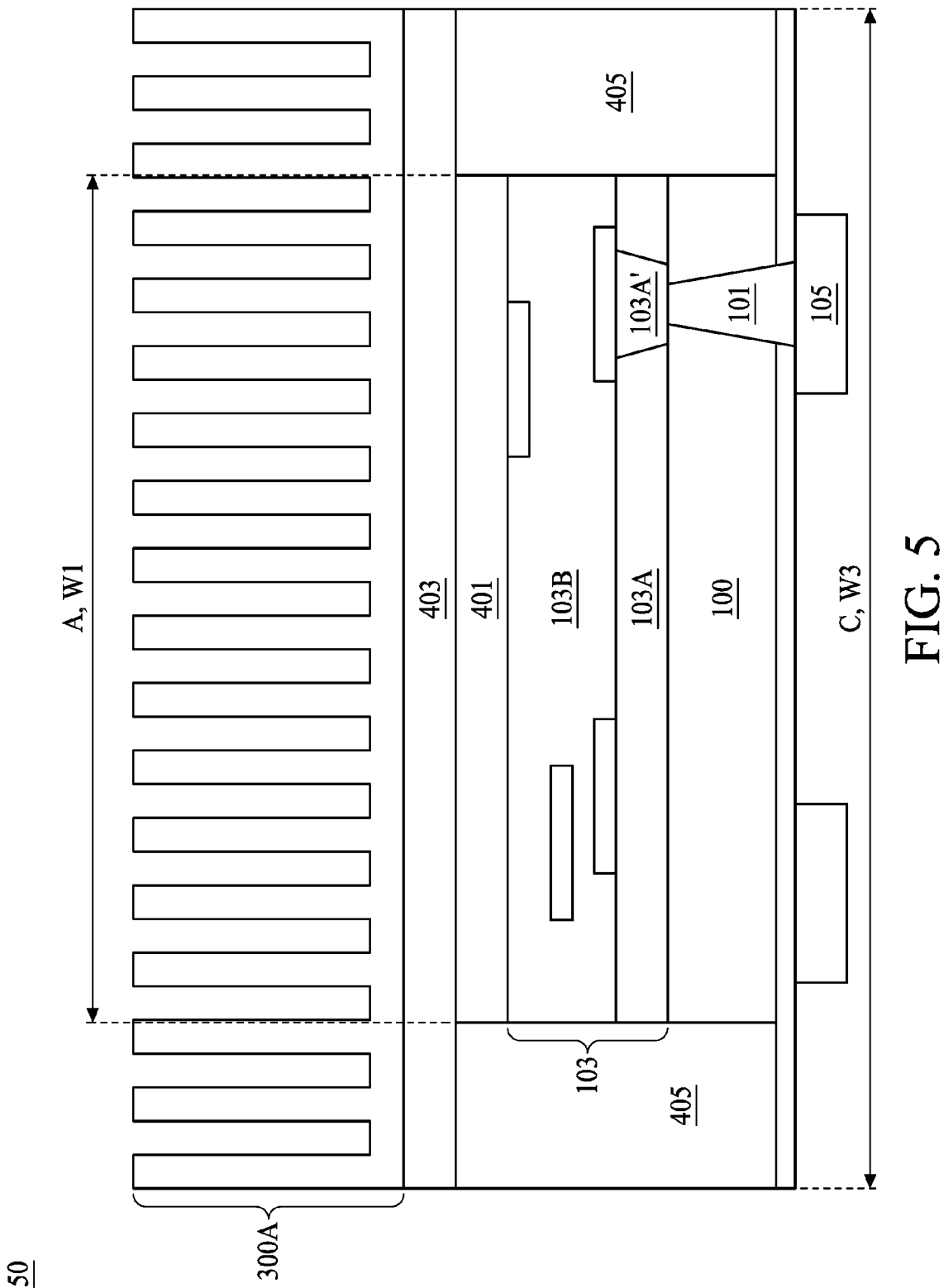

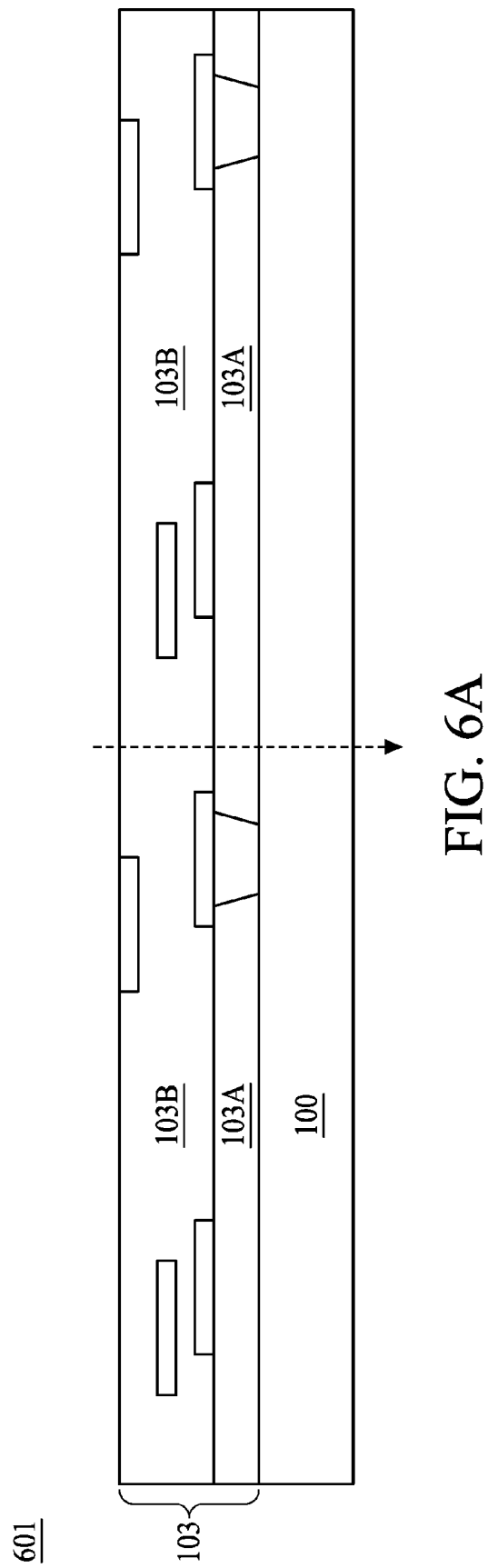

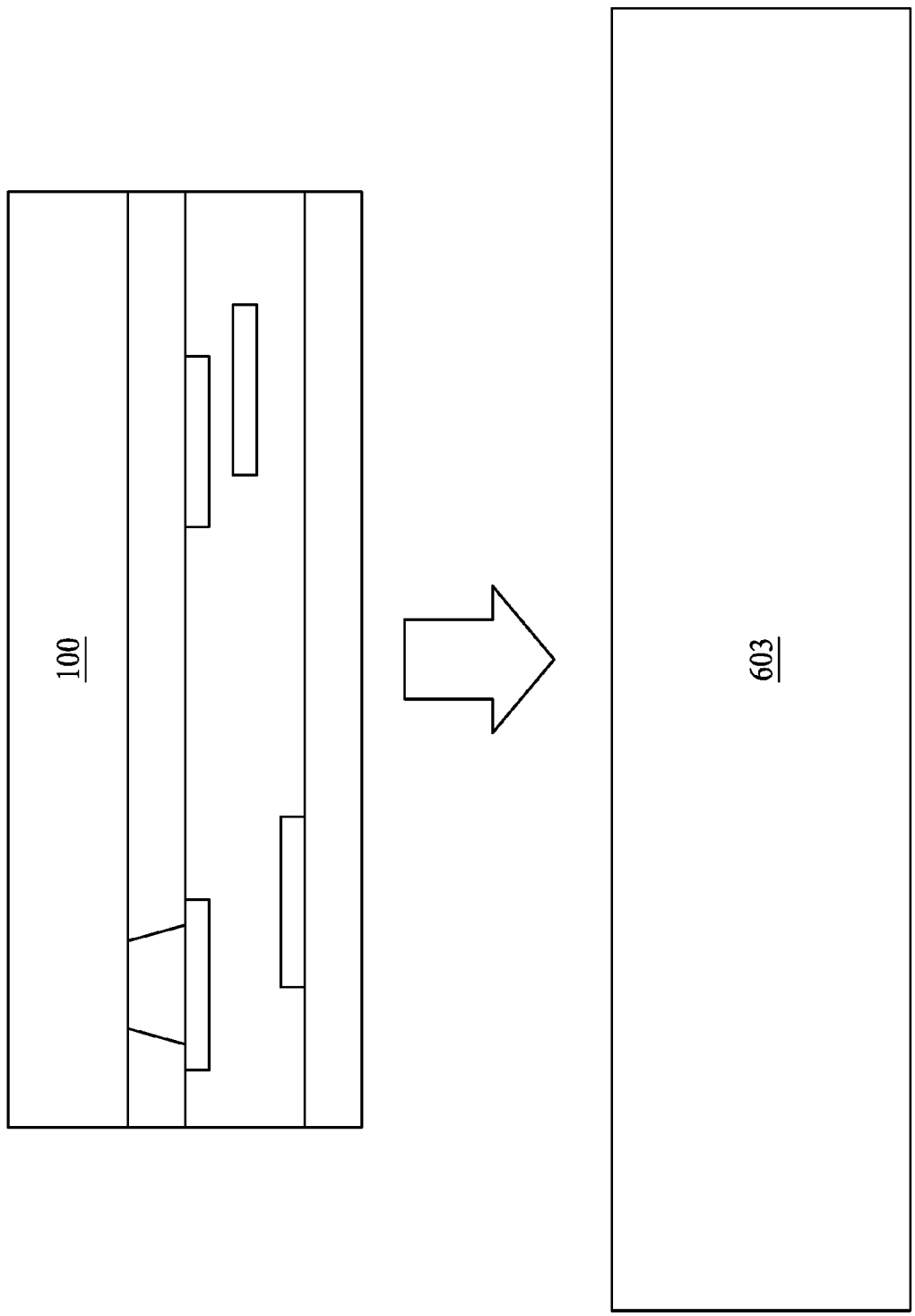

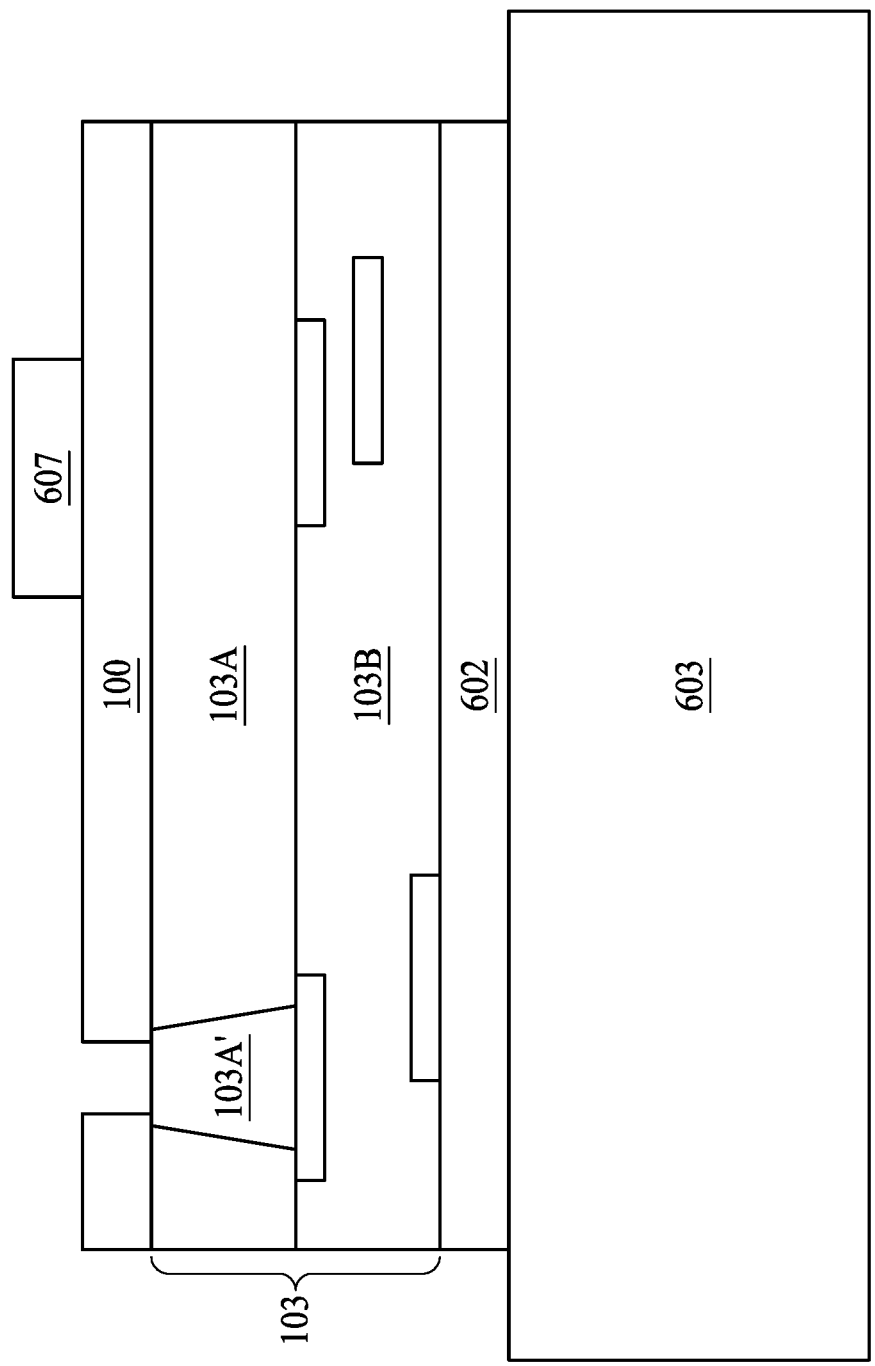

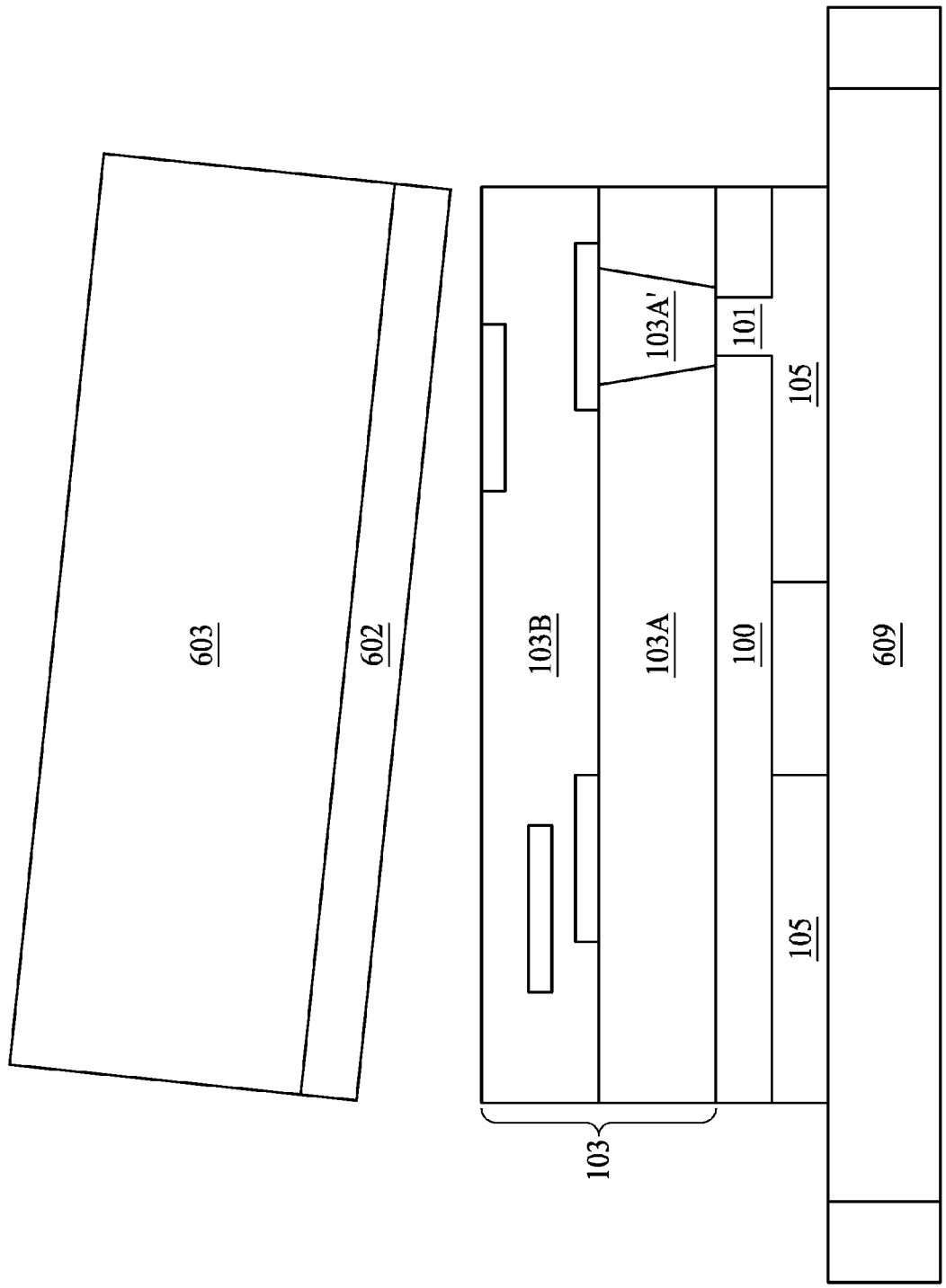

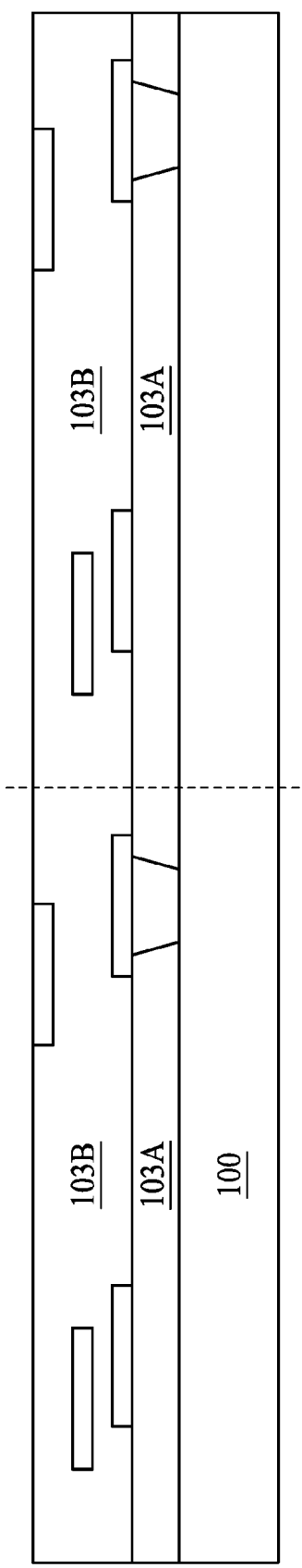

US 10,163,799 B2

SEMICONDUCTOR STRUCTURE AND METHOD OF MANUFACTURING THE SAME

FIELD

The present disclosure relates to a III-V-on-silicon semiconductor structure and a method for manufacturing the same.

BACKGROUND

In semiconductor technology, due to its characteristics, III-V layer-V materials, for example, gallium nitride (GaN), is used to form various integrated circuits, such as high power field-effect transistors, high frequency transistors, or light-emitting diodes (LEDs). Usually, GaN is formed on a substrate, such as a sapphire or silicon carbide substrate, with a certain crystalline lattice mismatch. Such substrates are expensive in terms of material and/or fabrication. Because GaN on silicon is an ideal structure for high power devices or LEDs, with reduced costs, it is desired to grow GaN on silicon substrates. However, the integration of smaller size wafer (e.g., 6-inch or 8-inch) onto a larger size wafer (e.g., 12-inch) and heat dissipation of such III-V-on-silicon structure has hindered the advance of the device performance. Therefore, a III-V-on-silicon structure designed to address the above issues and a method of making the same are needed.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

FIG. 5 is a III-V-on-silicon semiconductor structure in accordance with some embodiments of the present disclosure.

FIG. 6A to FIG. 6L illustrate fragmental cross sectional views of a method for manufacturing a III-V-on-silicon semiconductor structure in accordance with some embodiments of the present disclosure.

FIG. 7A to FIG. 7F illustrate fragmental cross sectional views of a method for manufacturing a III-V-on-silicon semiconductor structure in accordance with some embodiments of the present disclosure.

DETAILED DESCRIPTION OF THE INVENTION

Figure 1:
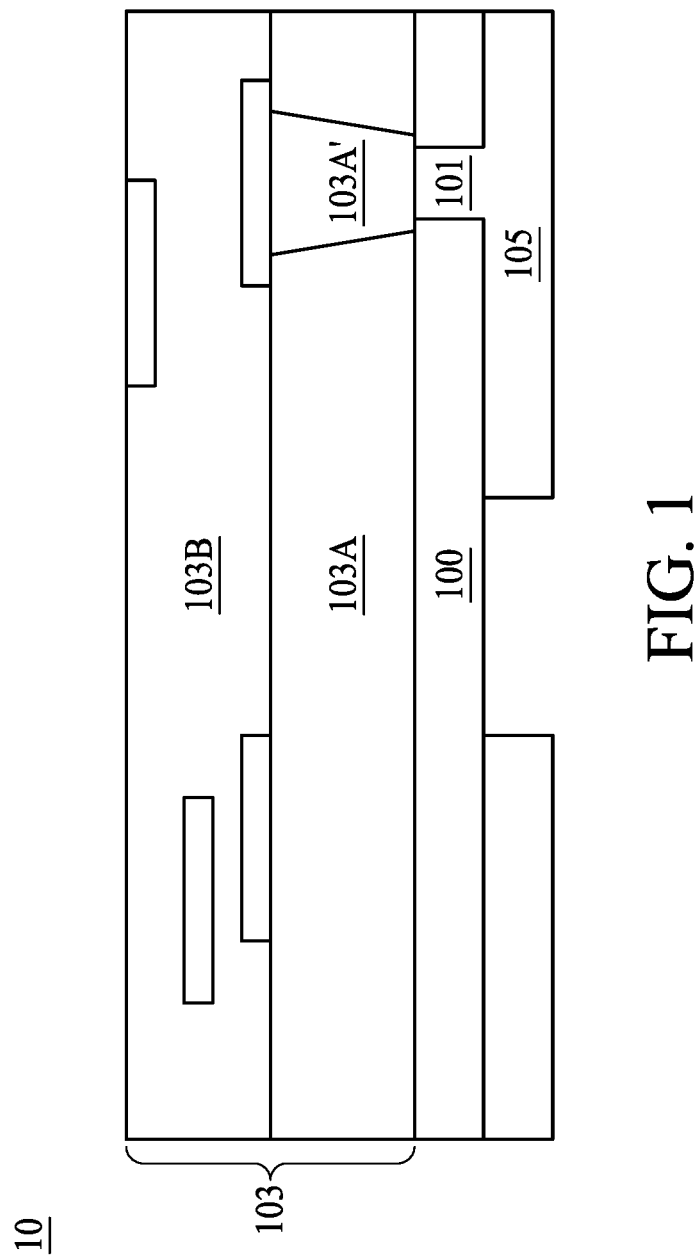
FIG. 1 is a III-V-on-silicon semiconductor structure in accordance with some embodiments of the present disclosure.

In the drawings, like reference numbers are used to designate like or similar elements throughout the various views and illustrative embodiments of the present invention are shown and described. The figures are not necessarily drawn to scale, and in some instances the drawings have been exaggerated and/or simplified in places for illustrative purposes only. One of ordinary skill in the art will appreciate the many possible applications and variations of the present invention based on the following illustrative embodiments of the present invention.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

As will be appreciated further herein, the present disclosure relates to improved techniques for high-density capacitors, which are formed in an integrated circuit process or in a stand-alone technology for subsequent wafer level or chip level interconnect between an IC and a capacitor chip. In these high density capacitors, two or more deep trench capacitors are "stacked" over one another and are coupled in parallel to increase capacitance density, relative to conventional implementations. Although several examples are illustrated and described below, these examples do not in any way limit the scope of the present disclosure.

Conventionally III-V-on-silicon semiconductor structure is commercialized in 6-inch and 8-inch wafers. The mainstream 12-inch silicon wafer is in need to integrate with those III-V-on-silicon semiconductor structures either in a chip-on-wafer fashion or a wafer-on-wafer fashion. On the other hand, the III-V-on-silicon semiconductor structure is an ideal replacement for a GaN LED since the conventional sapphire substrate has lower thermal conductivity than a silicon substrate. The present disclosure provides an III-V-on-silicon semiconductor structure packaging scheme which implements a through silicon via (TSV) and direct bonding technology into the III-V-on-silicon semiconductor structure that allows better integration of III-V-on-silicon semiconductor structure to a standardized 12-in wafer platform with better thermal dissipation capability.

Referring to FIG. 1, FIG. 1 is a III-V-on-silicon semiconductor structure 10 in accordance with some embodiments of the present disclosure. The III-V-on-silicon semiconductor structure 10 includes a silicon layer 100, a through silicon via (TSV) 101 in the silicon layer 100, and a III-V structure 103 over the silicon layer 100.

In some embodiments, the silicon layer 100 can be a bulk semiconductor wafer having a first conductivity type at a first doping concentration. For example, the silicon layer 100 can be a silicon wafer that is lightly doped with a p-type dopant, or can be heavily doped with a p-type dopant. The silicon layer 100 can be implemented as a bulk silicon wafer substrate. Further, the silicon layer 100 can also include non-semiconductor materials such as oxide in silicon-on-insulator (SOI), partial SOI substrate, polysilicon, amorphous silicon, or organic materials, among others. In some embodiments of the present disclosure, the silicon layer 100 can include multiple wafers or dies which are stacked or otherwise adhered together.

In some embodiments, the silicon layer 100 is having a thickness of less than about 100 micrometer. Commercially acquired GaN-on-Si wafer may initially have a silicon layer thickness of 775 micrometer. A thin down operation is applied to the silicon layer to obtain a 100 micrometer thickness or less in facilitating subsequent gap filling operation. In some embodiments, a thickness of the silicon layer 100 is about 30 micrometer. In other embodiments, a thickness of the silicon layer 100 is about 50 micrometer. Since the thickness of the device layer 103B is comparably negligible to the thickness of the silicon layer 100, a stair height of less than about 100 micrometer is considered suitable to achieve high gap filling rate through a proper mechanism, for example, spin coating.

The III-V structure 103 further includes a bulk III-V layer 103A and a device layer 103B. In some embodiments, the III-V structure 103 is electrically coupling to the TSV 101 through a conductive path 103A' in the bulk III-V layer 103A. The conductive path 103N can take different forms in the bulk III-V layer 103A. For example, the conductive path 103A' can be a through via composed of aluminum. In other embodiments, the conductive path 103A' can take other suitable forms to electrically connect components at both sides of the bulk III-V layer 103A. In some embodiments, the TSV 101 may be composed of conductive materials such as Cu or W.

In some embodiments, the III-V structure 103 may include AlN, AlP, AlAs, AlSb, GaN, GaP, GaAs, GaSb, InGaAs, AlGaAs, InP, InAs, InSb, InSb, and alloy combinations thereof.

As shown in FIG. 1, a redistribution layer (RDL) 105 is disposed on a surface of the silicon layer 100 opposite to the surface in contact with the bulk III-V layer 103A. The RDL 105 is electrically coupled to the TSV 101 and the conductive path 103A', and further to the device layer 103B of the III-V structure 103. In some embodiments, the conductive path 103A' may include aluminum. Through the TSV 101 in the semiconductor layer 100, the signal generated from the device layer 103B can be transmitted to the other side of the III-V layer 103A which is opposite to the side in proximity to the device layer 103B.

In some embodiments, the heat generated from the device layer 103B can be effectively dissipated through the conductive path 103A' and through the TSV 101.

In some embodiments, the III-V-on-silicon semiconductor structure 10 can be a high power field-effect transistors, high frequency transistors, or light-emitting diodes.

Figure 2:
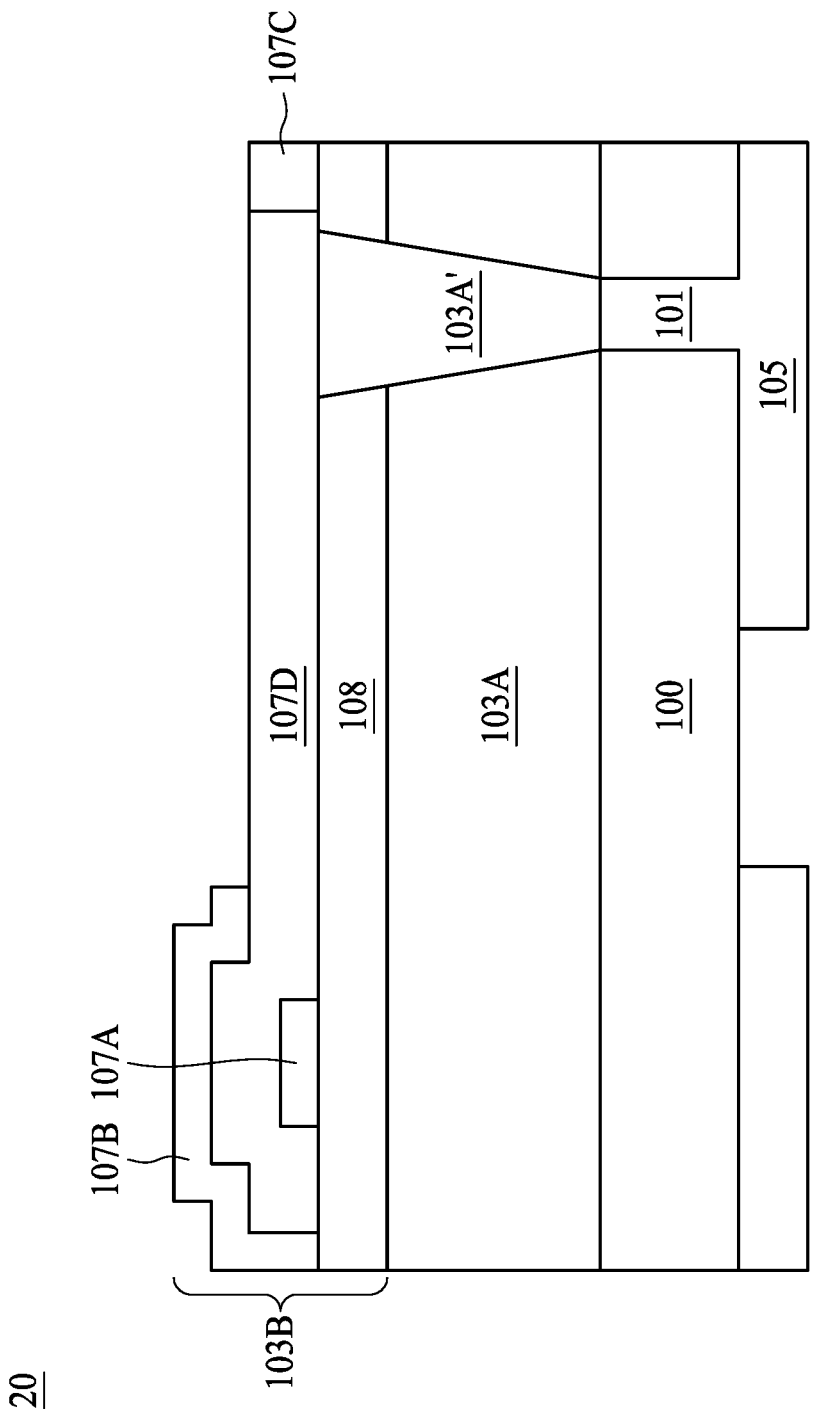
FIG. 2 is a III-V-on-silicon semiconductor structure in accordance with some embodiments of the present disclosure.

Referring to FIG. 2, FIG. 2 is a III-V-on-silicon semiconductor structure 20 in accordance with some embodiments of the present disclosure. FIG. 2 illustrate the device layer 103B previously discussed in detail. The III-V-on-silicon semiconductor structure 20 is a GaN high power field-effect transistor. As such, the device layer 103B may include a AlGaN layer 108 over the bulk III-V layer 103A and a gate 107A separated from source 107B and drain 107C by a dielectric layer 107D.

In some embodiments, the III-V-on-silicon semiconductor structure 20 can be a high power field-effect transistors, high frequency transistors, or light-emitting diodes.

Figure 3:
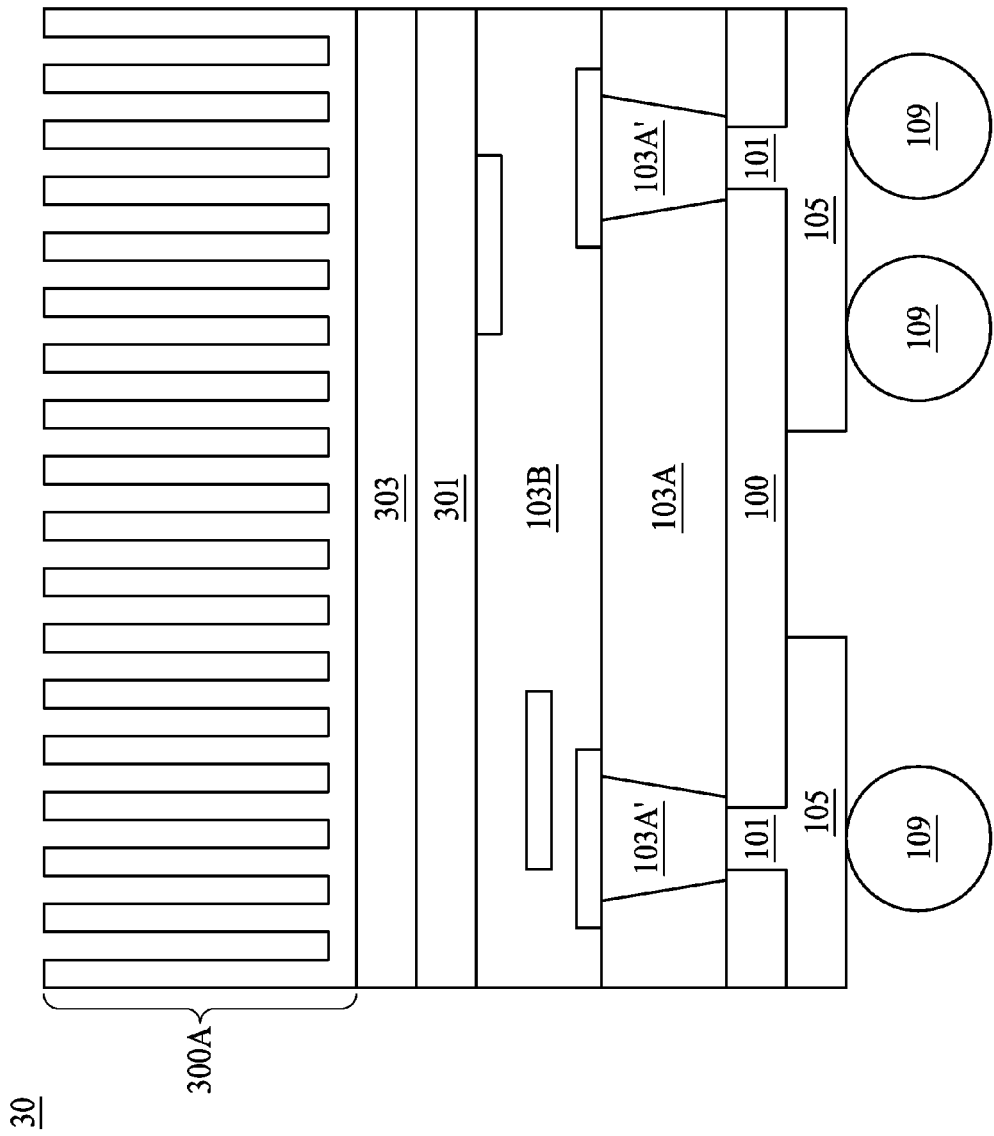
FIG. 3 is a III-V-on-silicon semiconductor structure in accordance with some embodiments of the present disclosure.

Referring to FIG. 3, FIG. 3 is a III-V-on-silicon semiconductor structure 30 in accordance with some embodiments of the present disclosure. Compared to FIG. 1, FIG. 3 further includes a heat spreader 300A over the III-V structure 103. For example, a fin-type heat spreader 300A is disposed over the device layer 103B via bonding layers 301 and 303. In some embodiments, the heat spreader 300A is made of silicon. In some embodiments, the III-V-on-silicon semiconductor structure 30 may include a plurality of TSVs 101 in the silicon layer 100. The TSVs 101 are individually connected to the conductive paths 103A' in the bulk III-V layer 103A. The bonding layers 301 and 303 can be dielectric materials suitable for fusion bond. The bonding layer 301 is deposited over the device layer 103B, and the bonding layer 303 is deposited over the heat spreader 300A. The two components are fusion bonded at their respective bonding layers 301, 303.

Moreover, RDL 105 of the III-V-on-silicon semiconductor structure 30 may further connect to a solder ball 109 or other conductive terminals such as conductive bumps or wire bonding structures.

In some embodiments, the III-V-on-silicon semiconductor structure 30 can be a high power field-effect transistors, high frequency transistors, or light-emitting diodes.

Figure 4:
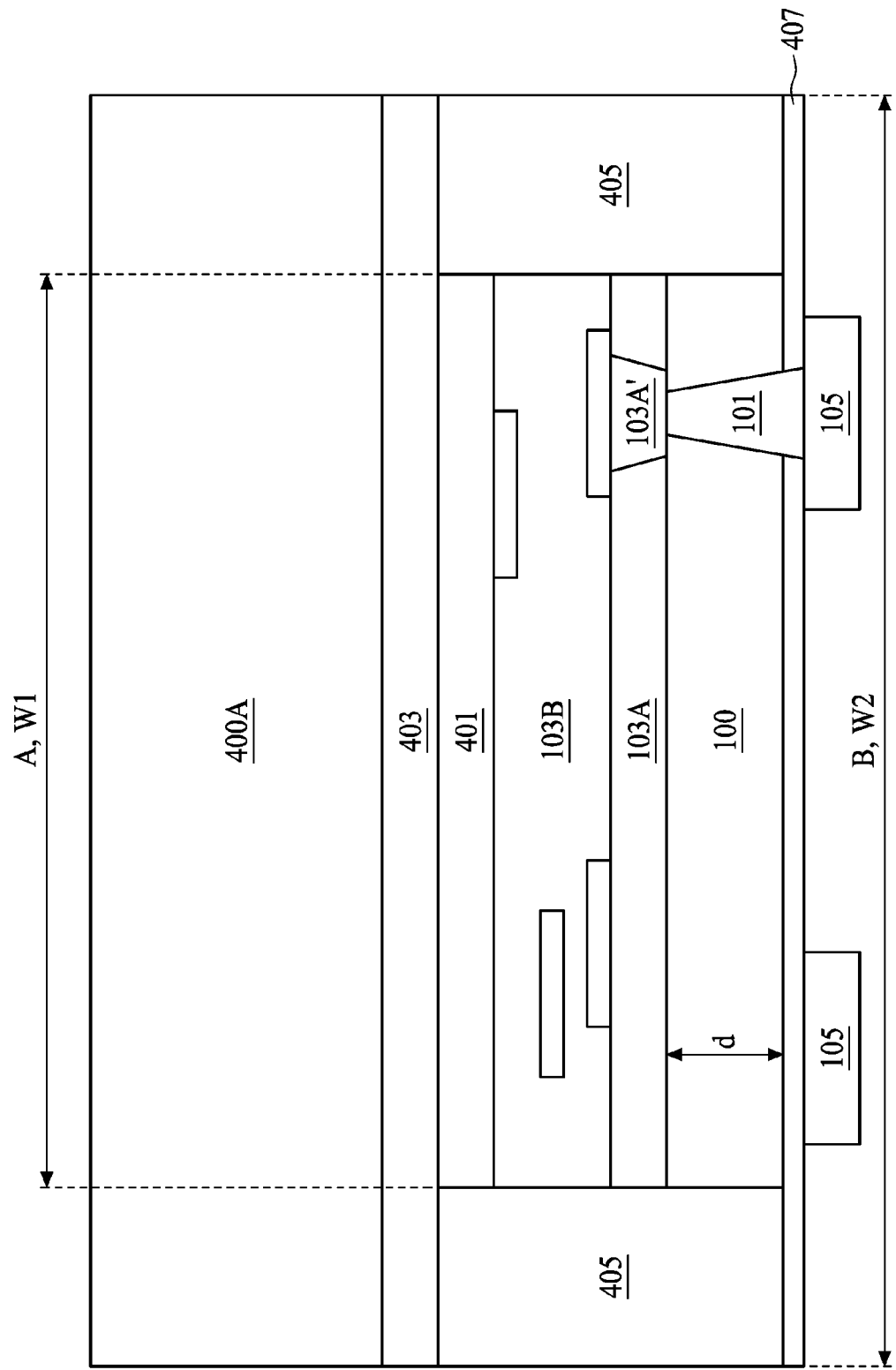
FIG. 4 is a III-V-on-silicon semiconductor structure in accordance with some embodiments of the present disclosure.

Referring to FIG. 4, FIG. 4 is a III-V-on-silicon semiconductor structure 40 in accordance with some embodiments of the present disclosure. In FIG. 4, the III-V structure 103 is disposed over the silicon layer 100. As previously discussed, a thickness "d" of the silicon layer 100 can be 30 micrometer, 50 micrometer, or 100 micrometer. A bonding layer 401 is disposed over another side more distant from the bulk III-V layer 103A of the III-V structure 103. In some embodiments, the bonding layer 401 covers a top surface of the III-V structure 103. The bonding layer 401 possesses first width W1 which is substantially equal to a width of the projected area A of the III-V structure 103. A bonding layer 403 is disposed over the bonding layer 401. In some embodiments, the bonding layer 403 covers a surface of the silicon layer 400A. The silicon layer 400A possesses second width W2 which is substantially equal to a width of the projected area B of the silicon layer 400A. In some embodiments, the silicon layer 400A is made of a silicon wafer having higher defect density than the silicon layer 100. In some embodiments, the silicon layer 400A is made of a recycled silicon wafer.

As shown in FIG. 4, the first width W1 is smaller than the second width W2. The projected area A of the III-V structure 103 is smaller than the projected area B of the silicon layer 400A. The discrepancies of the width between the first width W1 and the second width W2 is filled with gap-filling materials 405. Similarly, the difference between the projected area A and the projected area B is filled with gap-filling materials 405. In other words, the III-V-over-silicon structure is disposed over the silicon layer 400A and surrounded by the gap-filling materials 405.

In some embodiments, the III-V-on-silicon semiconductor structure 40 can be a high power field-effect transistors, high frequency transistors, or light-emitting diodes.

Referring to FIG. 5, FIG. 5 is a III-V-on-silicon semiconductor structure 50 in accordance with some embodiments of the present disclosure. In FIG. 5, the III-V structure 103 is disposed over the silicon layer 100. As previously discussed, a thickness "d" of the silicon layer 100 can be 30 micrometer, 50 micrometer, or 100 micrometer. A bonding layer 401 is disposed over another side more distant from the bulk III-V layer 103A of the III-V structure 103. In some embodiments, the bonding layer 401 covers a top surface of the III-V structure 103. The bonding layer 401 possesses first width W1 which is substantially equal to a width of the projected area A of the III-V structure 103. A bonding layer 403 is disposed over the bonding layer 401. In some embodiments, the bonding layer 403 covers a surface of the heat spreader 300A. The heat spreader 300A possesses third width W3 which is substantially equal to a width of the projected area C of the heat spreader 300A. In some embodiments, the heat spreader 300A is made of a silicon wafer having higher defect density than the silicon layer 100. In some embodiments, the heat spreader 300A is made of a recycled silicon wafer.

As shown in FIG. 5, the first width W1 is smaller than the third width W3. The projected area A of the III-V structure 103 is smaller than the projected area C of the heat spreader 300A. The discrepancies of the width between the first width W1 and the third width W3 is filled with gap-filling materials 405. Similarly, the difference between the projected area A and the projected area C is filled with gap-filling materials 405. In other words, the III-V-over-silicon structure is disposed over the heat spreader 300A and surrounded by the gap-filling materials 405.

In some embodiments, the III-V-on-silicon semiconductor structure 50 can be a high power field-effect transistors, high frequency transistors, or light-emitting diodes.

Referring to FIG. 6A to FIG. 6L, FIG. 6A to FIG. 6L illustrate fragmental cross sectional views of a method for manufacturing a III-V-on-silicon semiconductor structure in accordance with some embodiments of the present disclosure. In some embodiments, FIG. 6A to FIG. 6L illustrate manufacturing operations on a whole wafer basis and then die saw the wafer into semiconductor chips at the end of the manufacturing operations. In other embodiments, FIG. 6A to FIG. 6L illustrate manufacturing operations on chip basis where the die saw takes place at comparatively earlier stage of the packing operations and the known-good-die (KGD) are pick and placed over temporary carriers.

In FIG. 6A, a 6-inch, 8-inch, or a 12-inch III-V-on-silicon wafer 601 is acquired. The acquired wafer 601 includes a silicon layer 100 and a III-V structure 103 over the silicon layer 100. The III-V structure 103 further includes a bulk III-V layer 103A and a device layer 103B. A conductive path 103N can take different forms in the bulk III-V layer 103A. For example, the conductive path 103A' can be a through via composed of aluminum. In other embodiments, the conductive path 103A' can take other suitable forms to electrically connect components at both sides of the bulk III-V layer 103A.

As illustrated by dotted lines in FIG. 6A, the dicing of the 6-inch, 8-inch, or 12-inch III-V-on-silicon wafer 601 can be optionally taken place at the current operation. If die-sawed, the following description is directed to a semiconductor chip level packaging. If not die-sawed, the following description is directed to a semiconductor wafer level packaging.

Figure 6B:
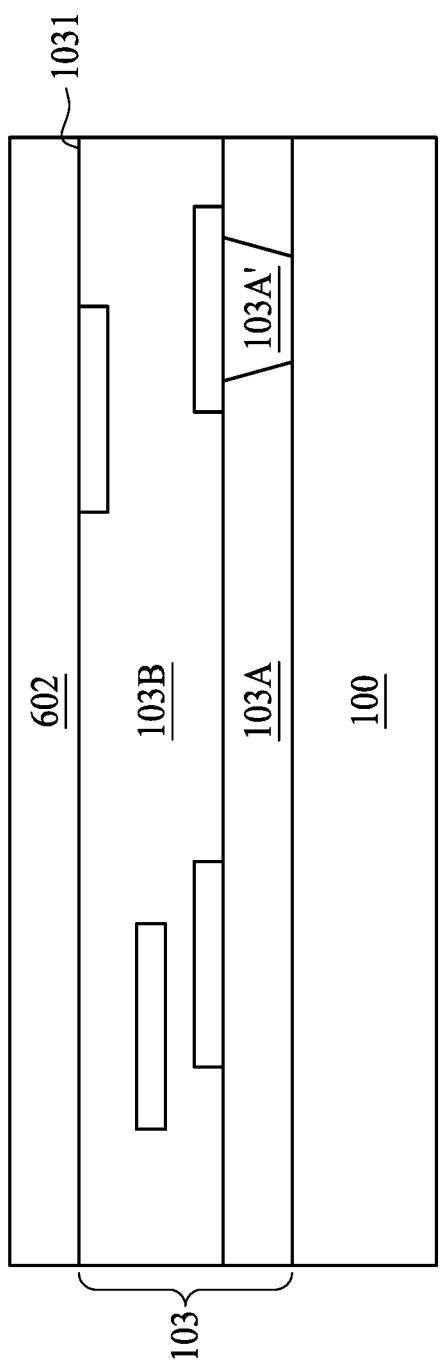

In FIG. 6B, an adhesive layer 602 is disposed over the top surface 1031 of the III-V structure 103. In one embodiment, the adhesive layer 602 may be adhesive tape or die attachment film (DAF), or alternatively, may be a glue or epoxy applied to the top surface 1031 via a spin-on process, or the like. In some embodiments, the adhesive layer 602 may be used to separate the temporary carrier (not shown) from the associated devices or layers in subsequent steps.

Figure 6D:
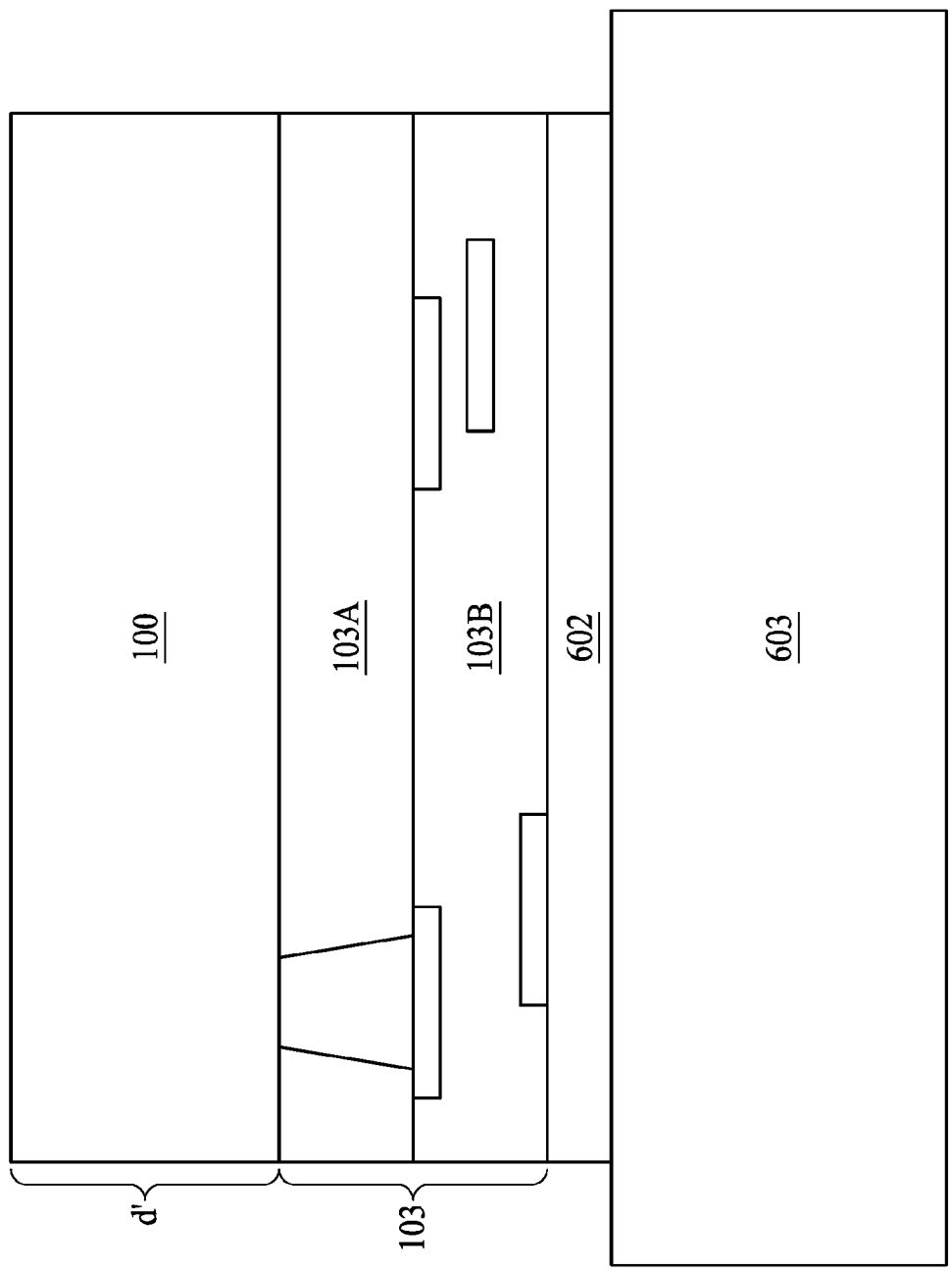
Figure 6E:
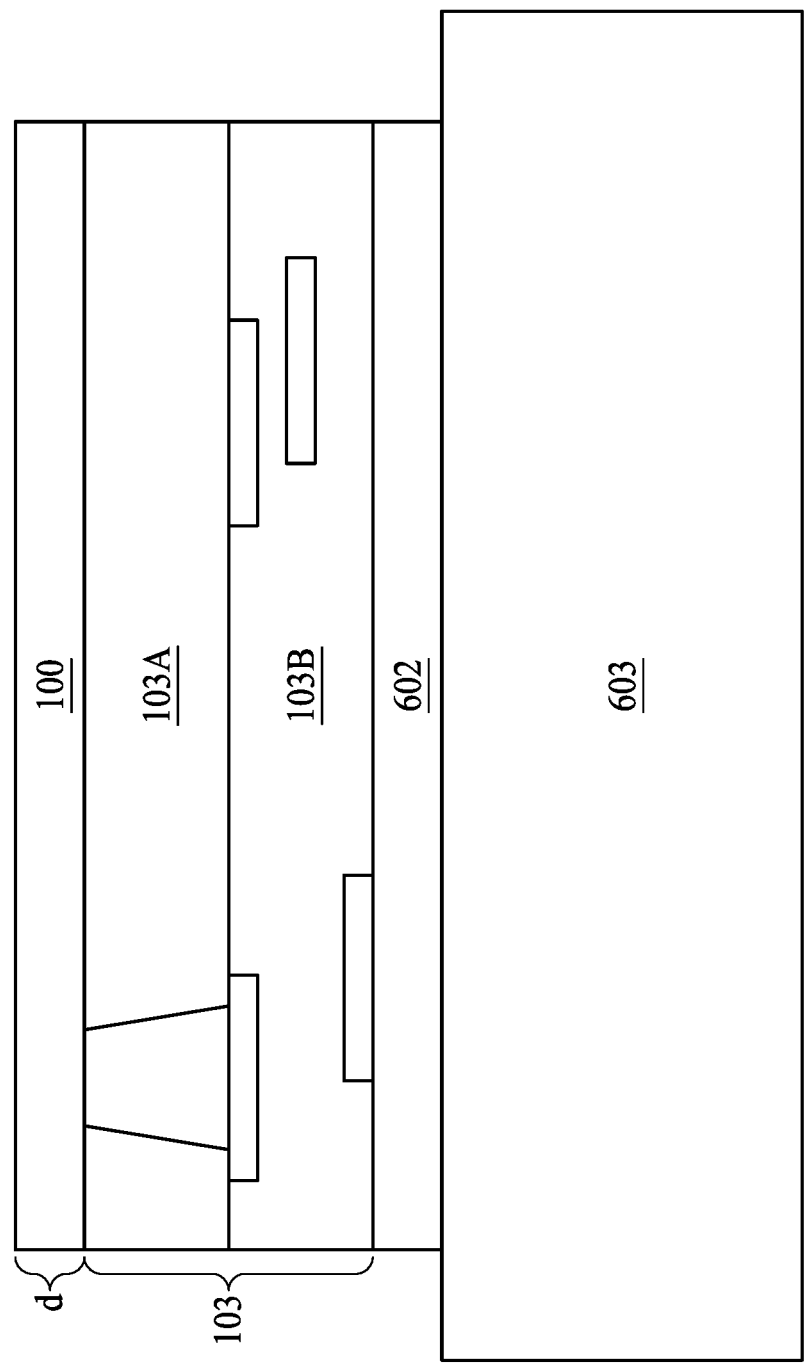
Figure 6G:

In FIG. 6C, the III-V structure 103 is attached to a temporary carrier 603 via the adhesive layer 602. In one embodiment, the temporary carrier 603 may be glass, but may alternatively be a wafer, semiconductor, metal, synthetic or other material having a suitable topography and structural rigidity. As shown in FIG. 6D, a thickness d' of the silicon layer 100 is more than about 700 micrometer. After attaching the III-V-on-silicon structure to the temporary carrier 603, a thin down operation takes place at the silicon layer 100 is performed to the desired final thickness, as illustrated in FIG. 6E. This can be done, for example, through grinding, etching, and/or polishing, resulting in a thinned silicon layer 100 with a predetermined thickness depending on the purpose for which the semiconductor package is used. In one embodiment, the silicon layer 100 is thinned to a thickness "d" of from about 30 μm to about 50 μm. In another embodiment, the silicon layer 100 is thinned to a thickness "d" of from about 50 μm to about 100 μm.

In FIG. 6F, a through silicon via (TSV) trench 605 is formed in the thinned silicon layer 100. In an embodiment of forming a TSV structure, the trench 605 is a TSV opening in which a metallization process will be performed. In defining the TSV opening, a hard mask layer (not shown) is formed over the silicon layer 100 followed by forming a patterned photoresist layer thereon. The hard mask layer may be a silicon nitride layer, a silicon oxynitride layer or the like. The photoresist layer (not shown) is patterned by exposure, bake, developing, and/or other photolithography processes known in the art to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed silicon layer 100, forming the TSV opening with sidewalls and a bottom, passing through at least a portion of the silicon layer 100. The TSV opening may be etched using any suitable etching method including, for example, a plasma etch, a chemical wet etch, a laser drill, and/or other processes known in the art. In an embodiment, the etching process includes a deep reactive ion etching (RIE) process to etch the silicon layer 100. The etching process may be such that the TSV opening is etched from the thinned surface to reach approximately the underlying conductive path 103A'. A conductive material, such as copper, tungsten, or the like, is deposited over TSV opening through, for example, sputtering, PVD, CVD, plating or another deposition process. A chemical mechanical polishing (CMP) may be performed to level the deposited metal with the thinned surface of the silicon layer 100. Alternatively, the metal deposition over the TSV opening may be delayed and to be formed concurrently with the RDL 105 shown in FIG. 6G.

Also shown in FIG. 6F, a patterned photoresist layer 607 is also formed over the silicon layer 100. In some embodiments, a conductive material, such as copper, is deposited over the patterned photoresist layer 607 through, for example, sputtering, PVD, CVD, plating or another deposition process. The deposited conductive material is patterned by lifting off the patterned photoresist layer 607. It should be understood that in some embodiments, the illustrated RDL 105 in FIG. 6G have portions that extend laterally to provide a desired layout for subsequently formed layers or connectors. In some embodiments, the RDL 105 is electrically coupled to the TSV 101 concurrently formed, or as previously discussed, formed in a prior TSV opening-filling operation followed by a CMP.

Figure 6H:
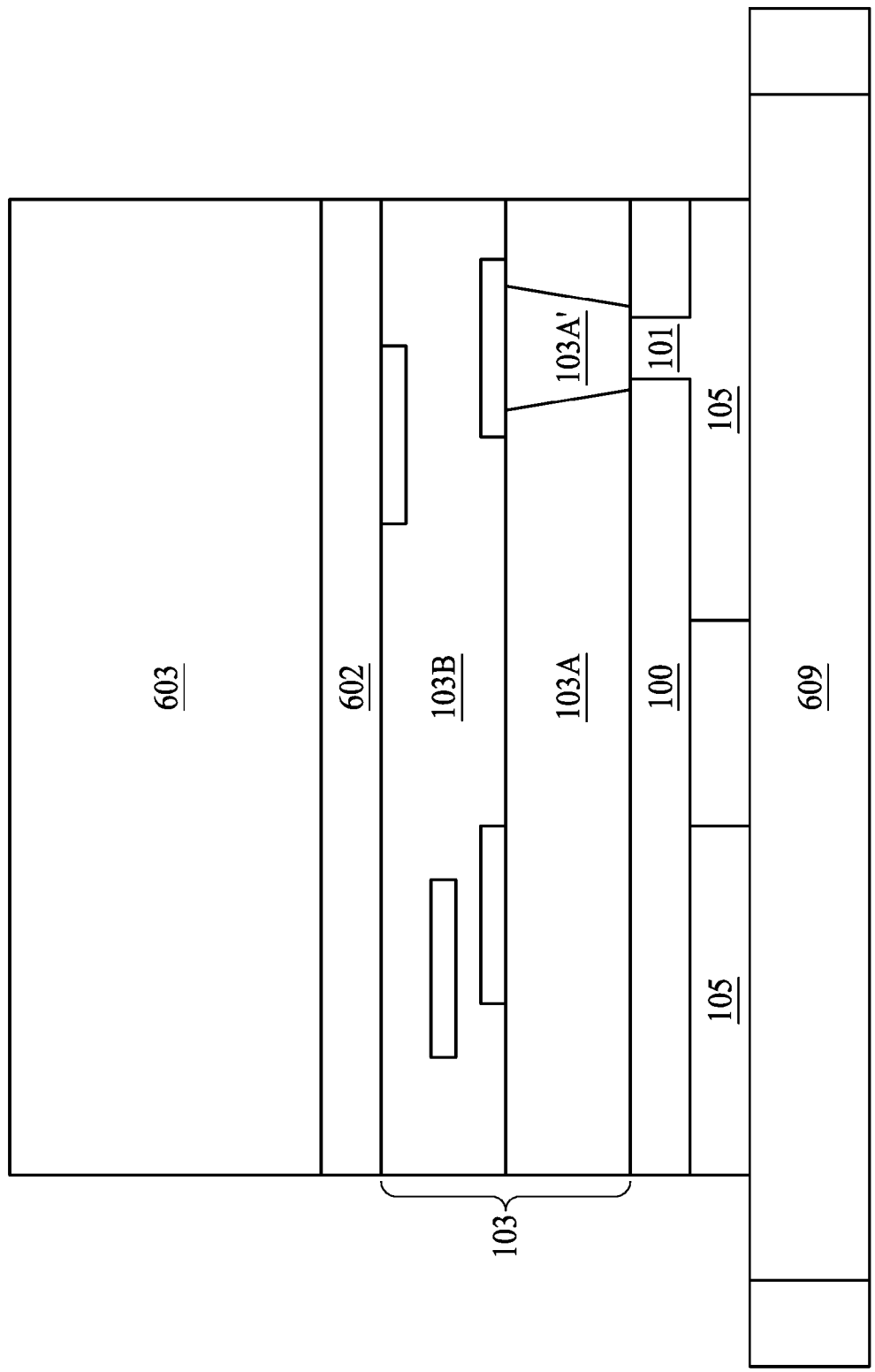
Figure 6J:
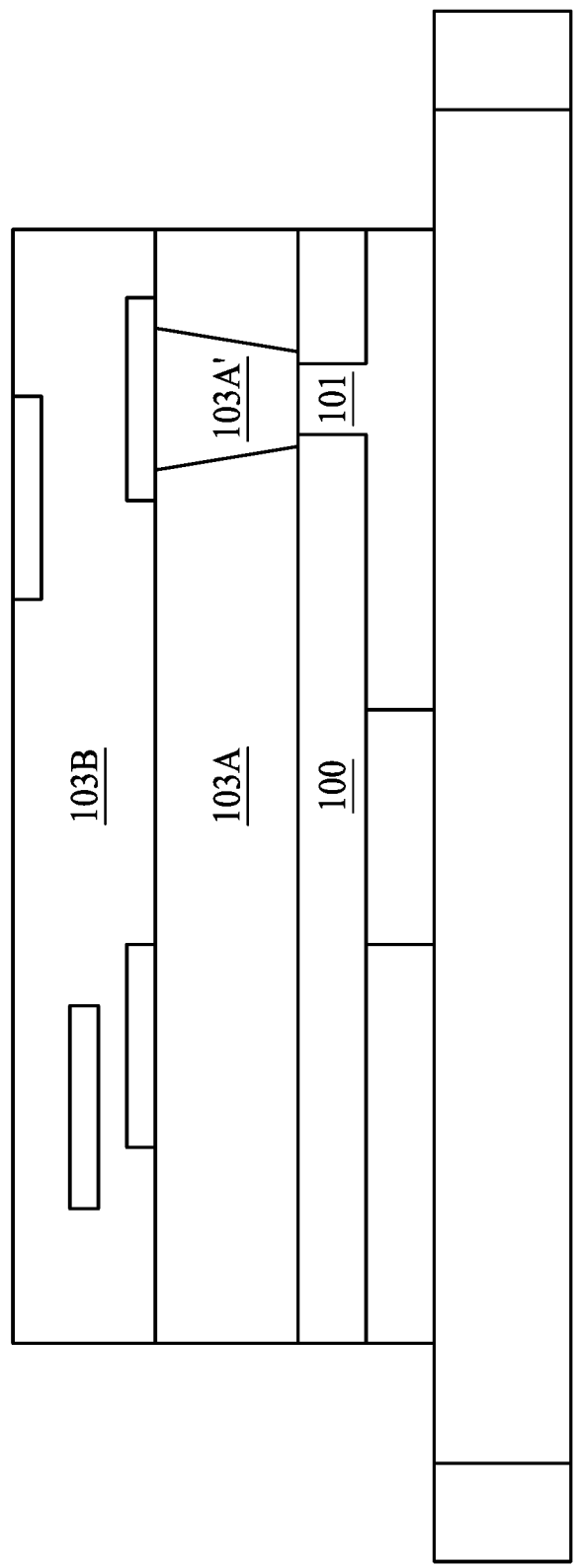

In FIG. 6H, FIG. 6I, and FIG. 6J, the temporary carrier 105 and the III-V structure 103 is flipped to disposed over a carrier tape 609 and debonding from the temporary carrier 105 in accordance with an embodiment. In an embodiment, the carrier tape 609 has an adhesive surface that is used to attach the RDL 105 to the carrier tape 609. The temporary carrier 105 is de-bonded. In an embodiment in which the adhesive layer 602 is formed of a light-sensitive adhesive, the temporary carrier 105 may be de-bonded by, for example, exposing the adhesive layer 602 to a UV light or a laser, causing it to lose its adhesive property.

Figure 6K:
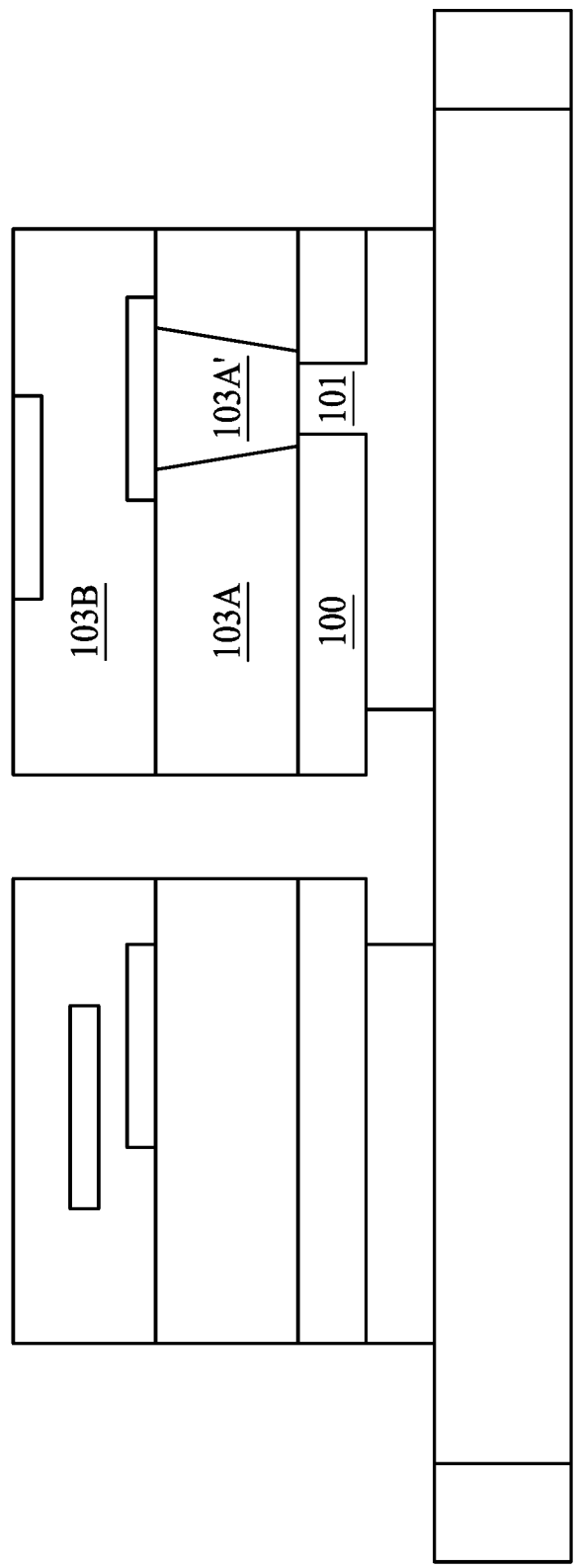
Figure 6L:
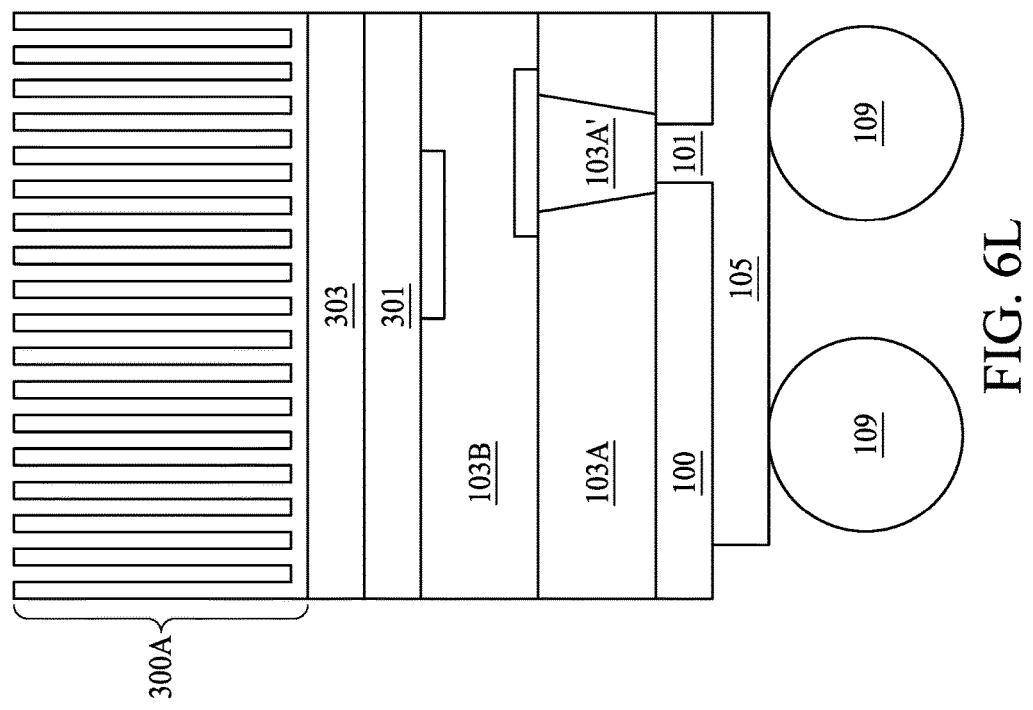

Referring to FIG. 6K, a die saw is performed to separate the two neighboring chips. The die sawing operation is performed if previously discussed operations are conducted on a wafer-level packaging. In FIG. 6L, a fin-type heat spreader 300A is placed over the top surface 1031 of the device layer 103B via bonding layers 301, 303. Alternatively, the bonding layers 301, 303 may be replaced by an adhesive layer such as an adhesive tape, a glue, epoxy, or deposited dielectric materials. Electrical terminal such as solder ball 109, solder bumps, or wire bonding structures is formed at the RDL 105 at the silicon layer 100. In some embodiments, heat generated from the device layer 103B of the III-V structure 103 can be effectively dissipated through two major paths: 1) an interface between the device layer 103B and heat spreader 300A, and 2) the conductive path 103A', the TSV 101, the RDL 105, and the solder balls 109. Compared to a sapphire layer counterpart, as conventionally used in a GaN LED, the heat generated in the III-V device described herein can be effectively dissipated through a heat spreader from one side and through multiple electrical conductive paths from the opposite side.

Referring to FIG. 7A to FIG. 7F, FIG. 7A to FIG. 7F illustrate fragmental cross sectional views of a method for manufacturing a III-V-on-silicon semiconductor structure in accordance with some embodiments of the present disclosure. In some embodiments, FIG. 7A to FIG. 7F illustrate manufacturing operations on a whole wafer basis and then die saw the wafer into semiconductor chips at the end of the manufacturing operations. In other embodiments, FIG. 7A to FIG. 7F illustrate manufacturing operations on chip basis where the die saw takes place on a first wafer at comparatively earlier stage of the packing operations and the known-good-die (KGD) are pick and placed over a second wafer with a same size of a different size.

In FIG. 7A, a 6-inch, 8-inch, or a 12-inch III-V-on-silicon wafer 701 is acquired. The acquired wafer 701 includes a silicon layer 100 and a III-V structure 103 over the silicon layer 100. The III-V structure 103 further includes a bulk III-V layer 103A and a device layer 103B. A conductive path 103N can take different forms in the bulk III-V layer 103A. For example, the conductive path 103A' can be a through via composed of aluminum. In other embodiments, the conductive path 103A' can take other suitable forms to electrically connect components at both sides of the bulk III-V layer 103A.

As illustrated by dotted lines in FIG. 7A, the dicing of the 6-inch, 8-inch, or 12-inch III-V-on-silicon wafer 701 can be optionally taken place at the current operation. If die-sawed, the following description is directed to a semiconductor chip-on-wafer packaging. The die-sawed dies may undergo a testing operation and become known good dies. If not die-sawed, the following description is directed to a wafer-on-wafer packaging.

Figure 7B:
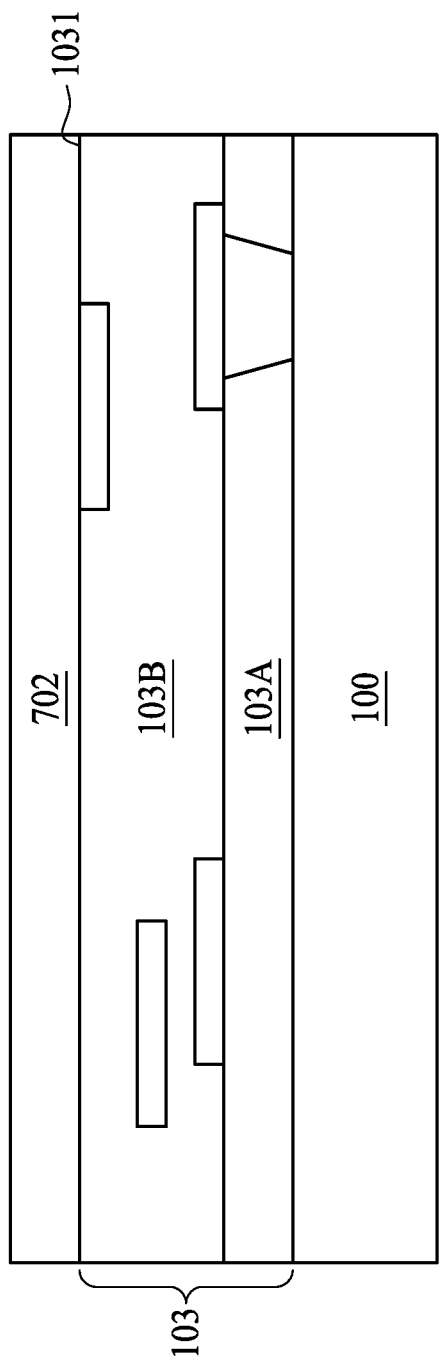

In FIG. 7B, a bonding film 702 is disposed over the top surface 1031 of the III-V structure 103. In one embodiment, the bonding film 702 may be silicon oxide, silicon nitride, silicon oxynitride, silicon carbide, silicon oxycarbide, low dielectric constant (low-k) dielectric material, ultra low-k dielectric material, other dielectric materials, or any combinations thereof.

Figure 7C:
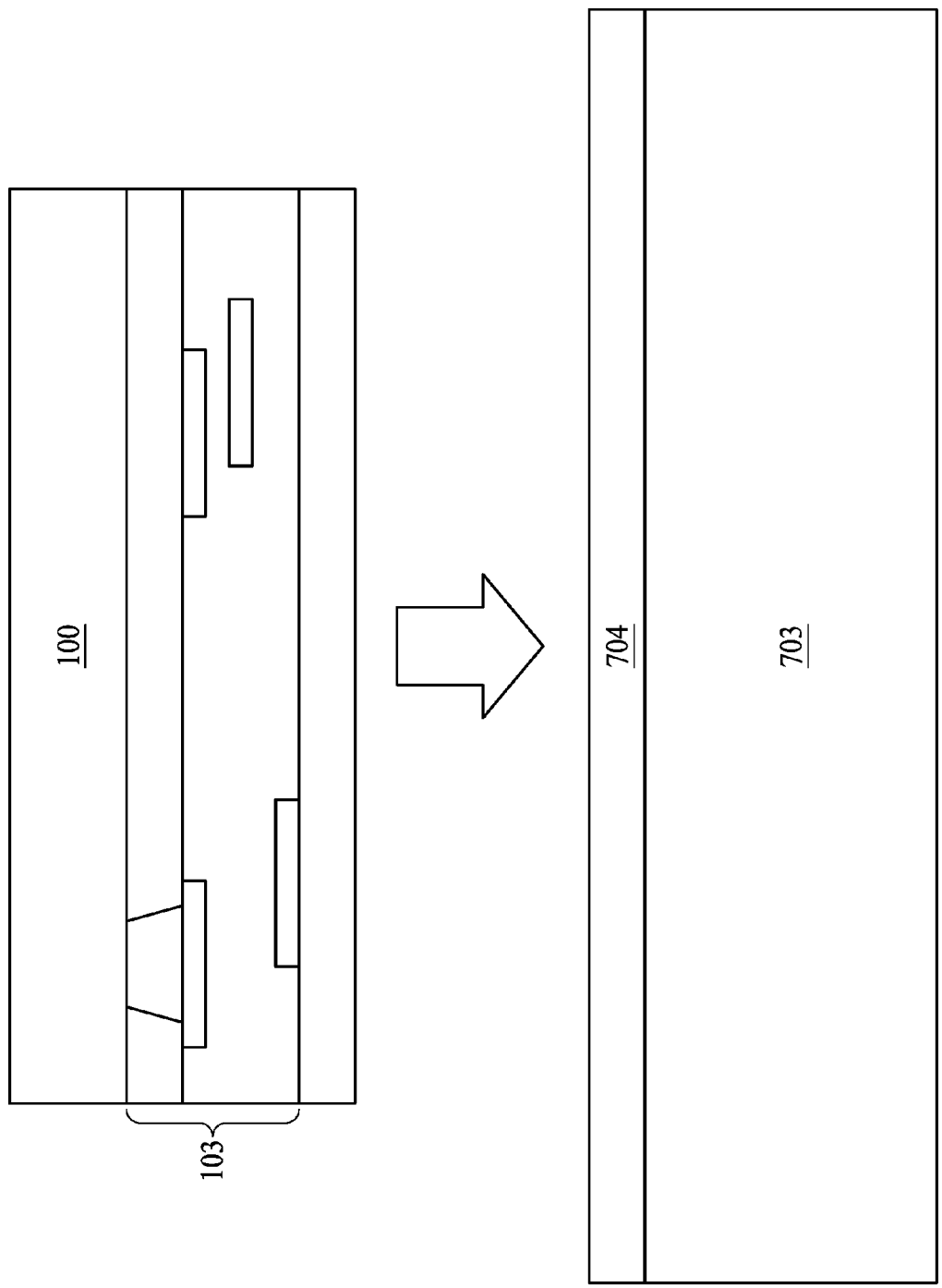

In FIG. 7C, the III-V structure 103 is bonded to a carrier 703 via the bonding film 702. In one embodiment, the carrier 703 may be made of a silicon wafer having higher defect density than the silicon layer 100. In some embodiments, the carrier 703 is made of a recycled silicon wafer. Another bonding film 704 is formed over the carrier 703. The bonding film 704 may be silicon oxide, silicon nitride, silicon oxynitride, silicon carbide, silicon oxycarbide, low dielectric constant (low-k) dielectric material, ultra low-k dielectric material, other dielectric materials, or any combinations thereof.

As shown in FIG. 7C, the III-V structure 103 is bonded to another carrier 703 through fusion bonding. The fusion bonding process can arise from $SiO_2$/Si bonding, Si/Si bonding, SiO2/$SiO_2$ bonding, and/or other suitable bonding. For example, the fusion bonding process involves bringing the bonding films 702 and 704 into intimate contact, which causes the bonding films 702 and 704 to bond together due to atomic attraction forces (i.e., Van der Waals forces). The s bonding films 702 and 704 are then subjected to an annealing process, after which a solid bond, e.g., a covalent bond, may be formed between the bonding films 702 and 704. A temperature for the annealing process is any suitable temperature, such as between about 200° C. and about 350° C.

Alternatively, the fusion bonding may be between Si and silicon dioxide ($SiO_2$), in accordance with some embodiments. If the fusion bonding is between Si and $SiO_2$, the bonding film 702 is made of $SiO_2$ and may be formed on the III-V structure 103. For example, if the fusion bonding is between Si and $SiO_2$, a bonding films 704 made of Si may be formed on carrier 703 to bond with a $SiO_2$ surface 702 of III-V structure 103, in accordance with some embodiments. In some embodiments, the bonding films 702 and 704 have a thickness in a range from about 10 Angstrom to about 2000 Angstrom.

If fusion bonding is between Si and $SiO_2$, the surfaces of Si and $SiO_2$ are made hydrophilic first. The Si and $SiO_2$ surfaces of the carrier 703 and the III-V structure 103 are then pressed together and annealed at a temperature in a range from about 500° C. to about 1200° C. to form Van der Waals bonds between Si surfaces. Outgassing of bonding films 702 and 704 is more complete when the annealing temperature is equal to or greater than about 450° C. The outgassing of chemicals in the bonding films 702 and 704 under Si/$SiO_2$ fusion bonding at a temperature greater than about 450° C. and less than about 1200° C. would be ideal.

Figure 7D:
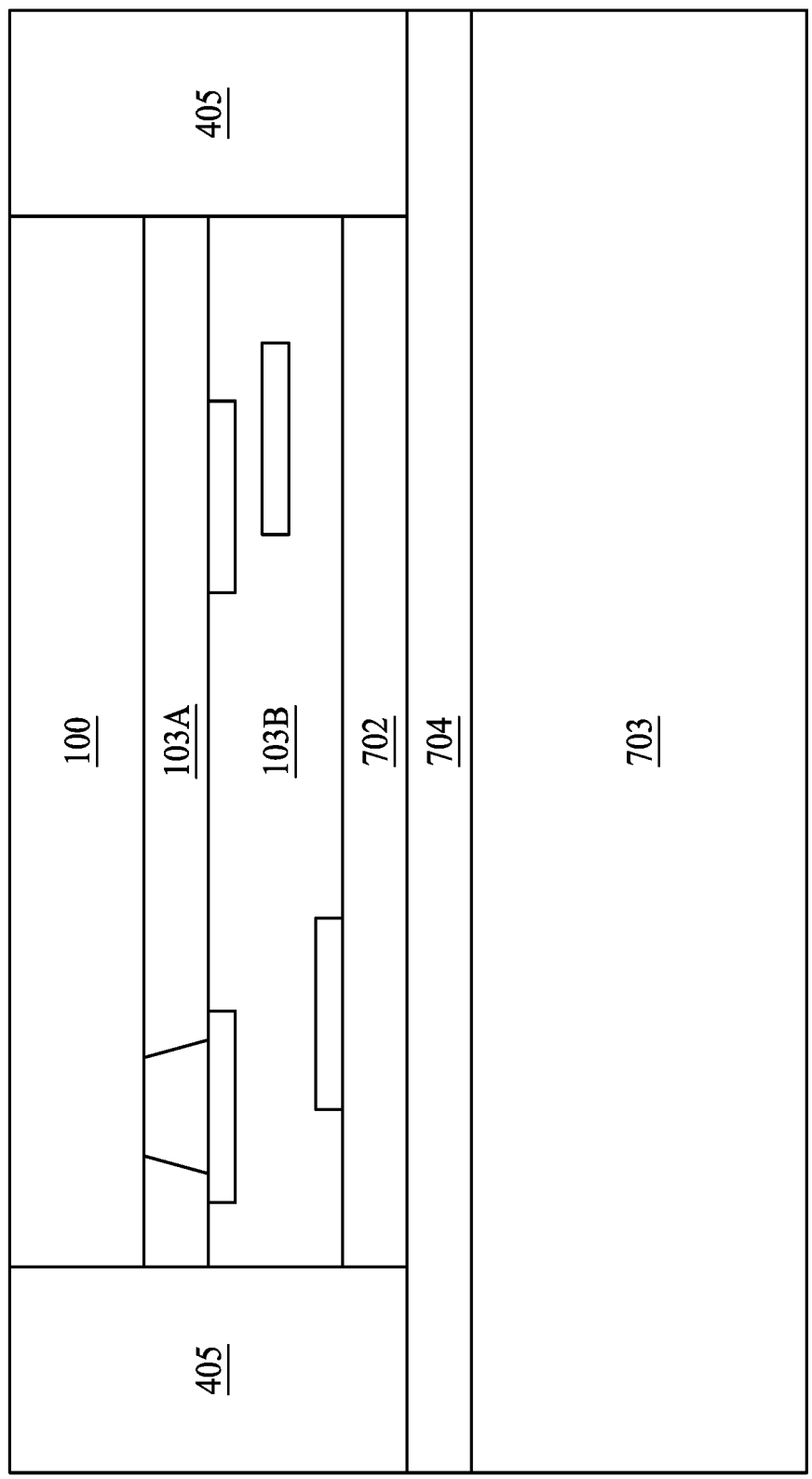

Referring to FIG. 7D, a thin down operation is applied to the silicon layer to obtain a 100 micrometer thickness or less in facilitating subsequent gap filling operation. In some embodiments, a thickness of the silicon layer 100 is about 30 micrometer. In other embodiments, a thickness of the silicon layer 100 is about 50 micrometer. Since the thickness of the device layer 103B is comparably negligible to the thickness of the silicon layer 100, a stair height of less than about 100 micrometer is considered suitable to achieve high gap filling rate through a proper mechanism. In some embodiments, gap filling is depositing dielectric materials over the bonded III-V structure 103 and the carrier 703. The gap filling 405 is preferably composed of materials such as silicon oxide and is deposited by plasma enhanced tetraethylorthosilieate (PETEOS). This plasma tetraethylorthosilicate (TEOS) oxide layer is preferably deposited using TEOS gas at a flow rate of between about 200 and 300 sccm and helium flow rate of between about 800 and 1200 sccm, an electrode spacing of between about 255 and 275 mils and more preferably 265 mils, at a pressure of between about 7 and 8 Torr, at a temperature of between about 400° and 450° C., at a power of between about 500 and 600 W.

Figure 7E:
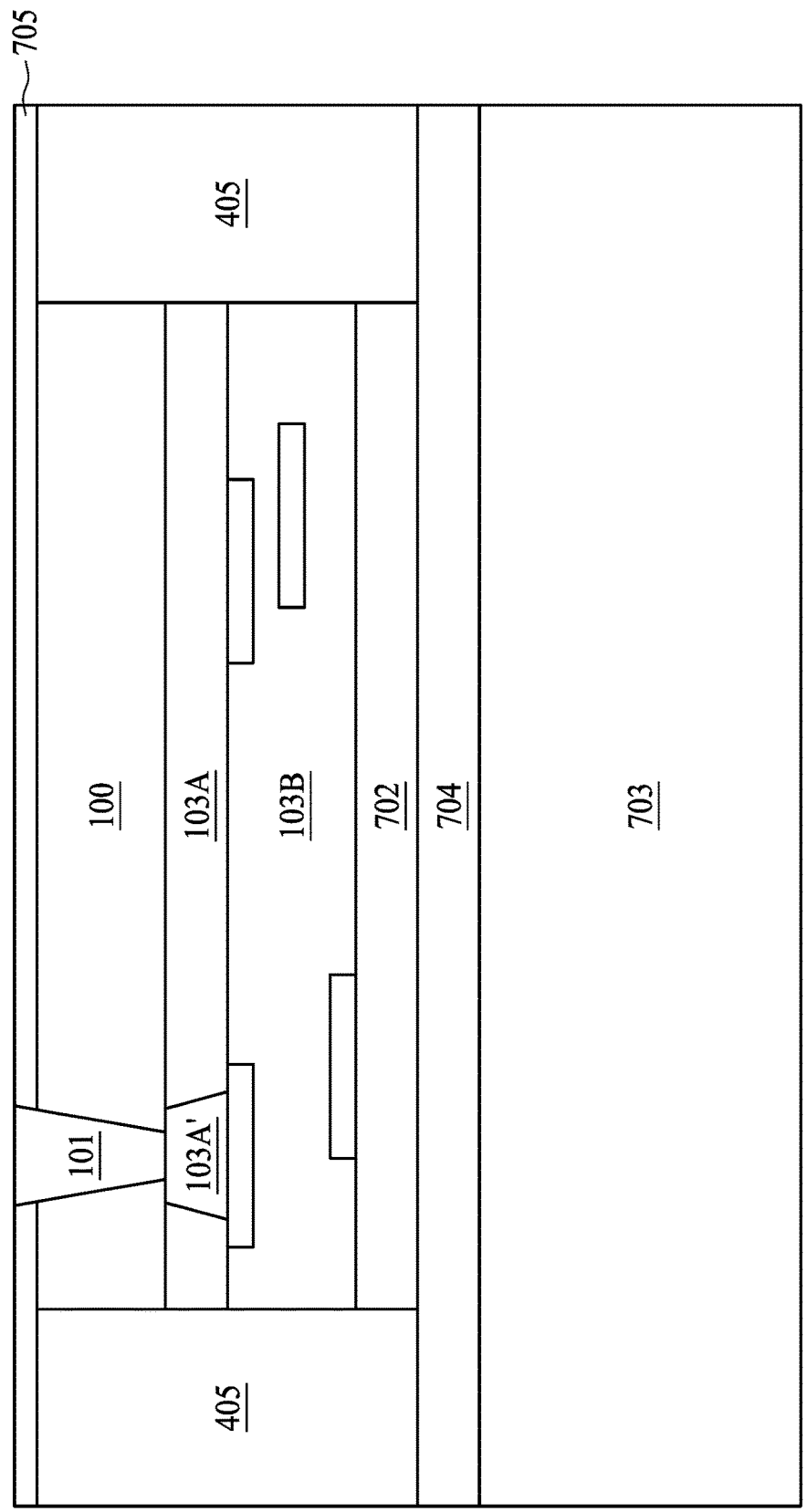

Referring to FIG. 7E, an isolation layer 705 is formed over the silicon layer 100 and the gap filling 405 by any suitable dielectric deposition operation. Subsequently, a through silicon via (TSV) trench is formed in the isolation layer 705 and the thinned silicon layer 100. In an embodiment of forming a TSV structure, the trench is a TSV opening in which a metallization process will be performed. In defining the TSV opening, a hard mask layer (not shown) is formed over the silicon layer 100 followed by forming a patterned photoresist layer thereon. The hard mask layer may be a silicon nitride layer, a silicon oxynitride layer or the like. The photoresist layer (not shown) is patterned by exposure, bake, developing, and/or other photolithography processes known in the art to provide an opening exposing the hard mask layer. The exposed hard mask layer is then etched, by a wet etch or dry etch process, using the patterned photoresist layer as a masking element to provide an opening. Using the hard mask layer and the patterned photoresist layer as mask elements, an etching process is performed to etch the exposed silicon layer 100, forming the TSV opening with sidewalls and a bottom, passing through at least a portion of the silicon layer 100. The TSV opening may be etched using any suitable etching method including, for example, a plasma etch, a chemical wet etch, a laser drill, and/or other processes known in the art. In an embodiment, the etching process includes a deep reactive ion etching (RIE) process to etch the silicon layer 100. The etching process may be such that the TSV opening is etched from the thinned surface to reach approximately the underlying conductive path 103A'. A conductive material, such as copper, tungsten, or the like, is deposited over TSV opening through, for example, sputtering, PVD, CVD, plating or another deposition process. A chemical mechanical polishing (CMP) may be performed to level the deposited metal with the surface of the isolation layer 705. Alternatively, the metal deposition over the TSV opening may be delayed and to be formed concurrently with the RDL 105 shown in FIG. 7F.

Figure 7F:
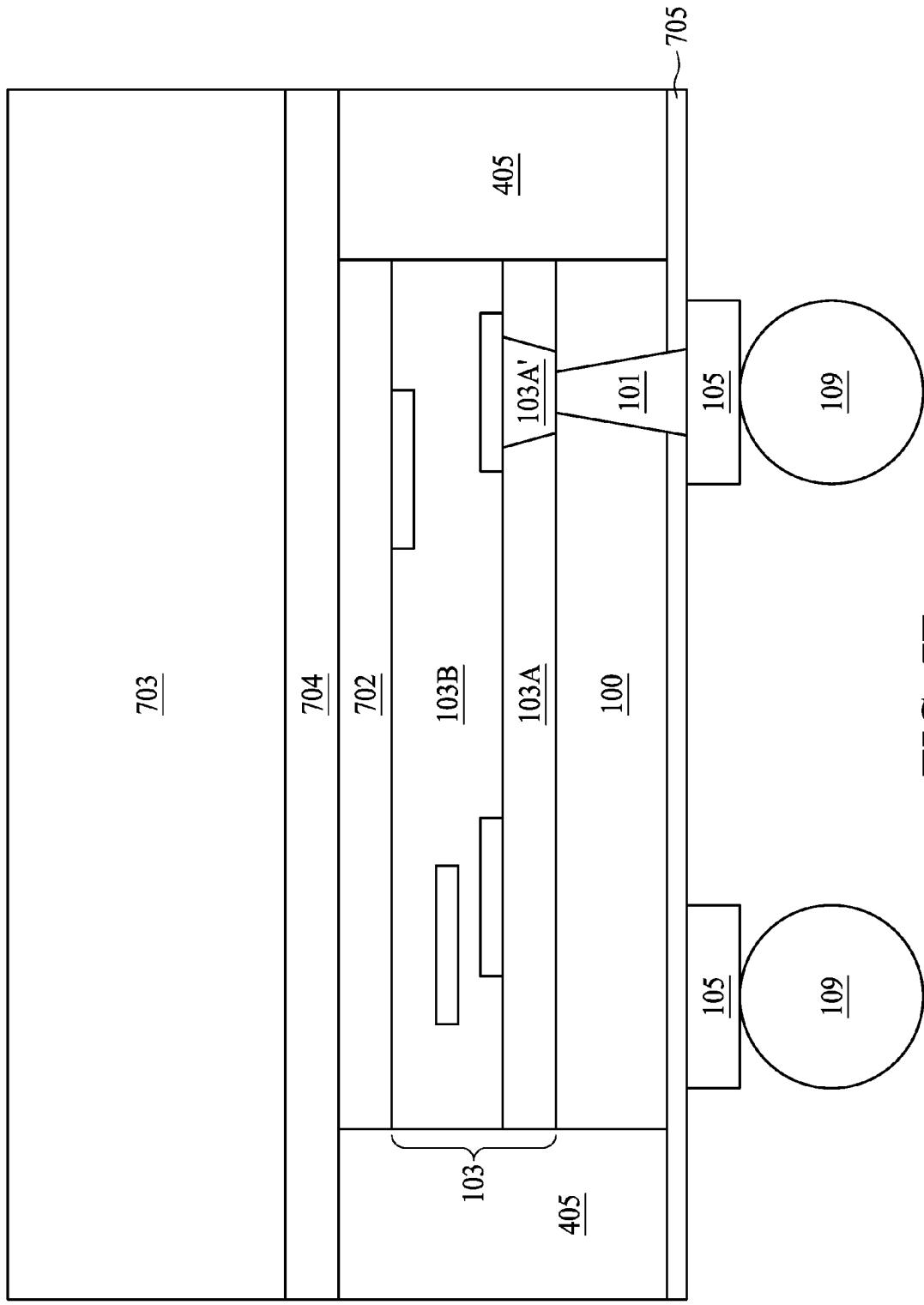

In FIG. 7F, a patterned photoresist layer (not shown) is formed over the isolation layer 705. In some embodiments, a conductive material, such as copper, is deposited over the patterned photoresist layer through, for example, sputtering, PVD, CVD, plating or another deposition process. The deposited conductive material is patterned by lifting off the patterned photoresist layer. It should be understood that in some embodiments, the illustrated RDL 105 in FIG. 7F have portions that extend laterally to provide a desired layout for subsequently formed layers or connectors. In some embodiments, the RDL 105 is electrically coupled to the TSV 101 concurrently formed, or as previously discussed, formed in a prior TSV opening-filling operation followed by a CMP.

As shown in FIG. 7F, heat generated from the device layer 103B of the III-V structure 103 can be effectively dissipated through two major paths: 1) an interface between the device layer 103B and the carrier 703, and 2) the conductive path 103N, the TSV 101, the RDL 105, and the solder balls 109. Compared to a sapphire layer counterpart, as conventionally used in a GaN LED, the heat generated in the III-V device described herein can be effectively dissipated through a heat spreader or the carrier from one side and through multiple electrical conductive paths from the opposite side.

For a wafer-on-wafer packaging, the III-V-on-silicon semiconductor structure as shown in FIG. 7F can integrate wafers of different diameters. For example, a 6-inch or a 8-inch III-V-on-silicon wafer is fusion bonded to a 12-inch silicon wafer, followed by die-sawing operations. For a chip-on-wafer packaging, the III-V-on-silicon known good dies are picked and placed through fusion bonding to a 12-inch silicon wafer.

Some embodiments of the present disclosure provide a semiconductor structure, including a first silicon layer having a through silicon via (TSV), a III-V structure over the first silicon layer, electrically coupling to the TSV, and a redistribution layer (RDL) under the first silicon layer, electrically coupling to the TSV.

Some embodiments of the present disclosure provide a semiconductor structure, including a first silicon layer having a through silicon via (TSV) and a III-V structure over the first silicon layer, electrically coupling to the TSV. The III-V structure includes a bulk portion and a device portion.

Some embodiments of the present disclosure provide a method of manufacturing a semiconductor device. The method includes providing a III-V-on-Si structure, comprising a III-V device over a silicon layer, forming a through silicon via (TSV) in the silicon layer, electrically coupling to the III-V device, and forming a redistribution layer (RDL) over a side of the silicon layer opposite to the III-V device.

Although the present invention and its advantages have been described in detail, it should be understood that various changes, substitutions and alterations can be made herein without departing from the spirit and scope of the invention as defined by the appended claims. For example, many of the processes discussed above cancan be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A semiconductor structure, comprising:
   a first silicon layer having a first surface and a second surface opposite to the first surface, through silicon via (TSV) penetrating from the first surface to the second surface;

a III-V structure having a bulk III-V portion and a device portion, the bulk III-V portion having a third surface directly bonded to the second surface of the first silicon layer, electrically coupling to the TSV; and a redistribution layer (RDL) at the first surface of the first silicon layer, electrically coupling to the TSV.

2. The semiconductor structure of claim 1, further comprising a heat spreader over the III-V structure.

3. The semiconductor structure of claim 2, wherein the heat spreader is bonded to the III-V structure via a dielectric layer.

4. The semiconductor structure of claim 1, further comprising a second silicon layer over the III-V structure.

5. The semiconductor structure of claim 4, wherein a projected area of the second silicon layer is greater than a projected area of the first silicon layer.

6. The semiconductor structure of claim 5, wherein the first silicon layer is laterally surrounded by a gap filling material.

7. The semiconductor structure of claim 1, wherein the first silicon layer is less than about 100 micrometers.

8. The semiconductor structure of claim 1, wherein the III-V structure comprises GaN.

9. The semiconductor structure of claim 1, further comprising a solder ball attached to the RDL.

10. A semiconductor structure, comprising:
a first silicon layer having a first surface and a second surface opposite to the first surface, a through silicon via (TSV) penetrating from the first surface to the second surface; and a III-V structure comprising a bulk III-V portion and a device portion, the bulk III-V portion having a third surface directly bonded to the second surface of the first silicon layer, electrically coupling to the TSV.

11. The semiconductor structure of claim 10, wherein the III-V structure comprises a light-emitting diode.

12. The semiconductor structure of claim 10, wherein the III-V structure comprises a high voltage metal-oxide-silicon field effect transistor.

13. The semiconductor structure of claim 10, wherein the bulk III-V portion comprises GaN.

14. The semiconductor structure of claim 10, further comprising a conductive path in the bulk III-V portion, electrically coupling the device portion and the TSV.

15. The semiconductor structure of claim 10, further comprising a heat spreader bonded to a side of the device portion opposite to the bulk III-V portion.

16. A method for manufacturing a semiconductor structure, comprising:
providing a III-V-on-Si structure, comprising a III-V device directly bonded to a silicon layer;

forming a through silicon via (TSV) in the silicon layer of the III-V-on-Si structure, the TSV electrically coupling to the III-V device; and forming a redistribution layer (RDL) over a side of the silicon layer opposite to the III-V device after providing the III-V-on-Si structure.

17. The method of claim 16, further comprising:
thinning the silicon layer to be less than 100 micrometers before forming the TSV in the silicon layer.

18. The method of claim 16, further comprising:
fusion-bonding the III-V-on-Si structure with a carrier at a side in proximity to the III-V device.

19. The method of claim 18, wherein III-V-on-Si structure is a wafer, a diameter of the III-V-on-Si structure is different from a diameter of the carrier.

20. The method of claim 18, wherein III-V-on-Si structure is a known good die.

* * * * *